United States Patent
Salleo et al.

(10) Patent No.: US 7,114,448 B2
(45) Date of Patent: Oct. 3, 2006

(54) METHOD FOR LARGE-AREA PATTERNING DISSOLVED POLYMERS BY MAKING USE OF AN ACTIVE STAMP

(75) Inventors: Alberto Salleo, San Francisco, CA (US); William S. Wong, San Carlos, CA (US)

(73) Assignee: Palo Alto Research Center, Incorporated, Palo Alto, CA (US)

( * ) Notice: Subject to any disclaimer, the term of this patent is extended or adjusted under 35 U.S.C. 154(b) by 287 days.

(21) Appl. No.: 10/703,049

(22) Filed: Nov. 6, 2003

(65) Prior Publication Data

US 2005/0098537 A1    May 12, 2005

(51) Int. Cl.
*C23F 1/00* (2006.01)
(52) U.S. Cl. .................................. 101/493
(58) Field of Classification Search ............... None
See application file for complete search history.

(56) References Cited

U.S. PATENT DOCUMENTS

| | | | | |
|---|---|---|---|---|
| 5,079,600 A | * | 1/1992 | Schnur et al. ............... 257/750 |
| 5,122,215 A | * | 6/1992 | Shibata et al. ............... 156/250 |
| 5,512,131 A | * | 4/1996 | Kumar et al. ............... 438/738 |
| 5,611,279 A | * | 3/1997 | Ando et al. ............... 101/401.1 |
| 5,772,905 A | | 6/1998 | Chou ........................... 216/44 |
| 5,776,748 A | * | 7/1998 | Singhvi et al. ............... 435/180 |
| 5,830,529 A | * | 11/1998 | Ross ........................... 427/152 |
| 5,948,621 A | * | 9/1999 | Turner et al. .................. 435/6 |
| 6,000,335 A | * | 12/1999 | Imamaki et al. ............ 101/327 |
| 6,015,603 A | * | 1/2000 | Ou-Yang ................ 428/195.1 |
| 6,027,595 A | * | 2/2000 | Suleski ........................ 156/230 |
| 6,165,911 A | * | 12/2000 | Calveley .................... 438/754 |
| 6,231,948 B1 | * | 5/2001 | Ouellette et al. ........... 428/131 |
| 6,276,272 B1 | * | 8/2001 | Takami et al. ............ 101/401.1 |
| 6,311,618 B1 | * | 11/2001 | Okumura et al. .......... 101/379 |
| 6,354,827 B1 | * | 3/2002 | Kerfeld ....................... 425/195 |
| 6,444,254 B1 | * | 9/2002 | Chilkoti et al. ............. 427/2.24 |
| 6,458,426 B1 | * | 10/2002 | Bulovic et al. .............. 427/458 |
| 6,468,819 B1 | * | 10/2002 | Kim et al. ..................... 438/22 |
| 6,673,287 B1 | * | 1/2004 | Breen et al. ................... 264/83 |
| 6,780,492 B1 | * | 8/2004 | Hawker et al. .............. 428/198 |
| 6,887,332 B1 | * | 5/2005 | Kagan et al. ............... 427/97.3 |
| 6,957,608 B1 | * | 10/2005 | Hubert et al. ............... 101/483 |
| 6,966,997 B1 | * | 11/2005 | Inganas et al. ................ 216/36 |
| 6,972,261 B1 | | 12/2005 | Wong et al. |
| 2002/0021657 A1 | * | 2/2002 | Lee et al. ................. 369/275.4 |
| 2002/0050220 A1 | * | 5/2002 | Schueller et al. ........... 101/486 |
| 2002/0094594 A1 | * | 7/2002 | Kim et al. ..................... 438/30 |
| 2003/0047535 A1 | * | 3/2003 | Schueller et al. ............. 216/41 |

(Continued)

OTHER PUBLICATIONS

Bulthaup et al., "All-Additive Fabrication of Inorganic Logic Elements by Liquid Embossing", Applied Physics Letters, vol. 79, No. 10, Sep. 3, 2001, pp. 1525-1527.

*Primary Examiner*—Allen Olsen
(74) *Attorney, Agent, or Firm*—Kent Chen (57) ABSTRACT

A method of patterning soluble materials on a substrate is described. In the method, a stamp is applied to a liquid carrier solution. The raised areas of the stamp removes mainly a liquid carrier leaving behind a precipitate while the non-raised areas of the stamp lifts both the liquid carrier and the precipitate from the substrate. The result is a precipitate pattern residue that matches the raised area of the stamp. One use of the method is for patterning large areas of polymers used in large area electronics such as displays and sensors.

28 Claims, 6 Drawing Sheets

U.S. PATENT DOCUMENTS

| | | | |
|---|---|---|---|
| 2003/0178316 A1* | 9/2003 | Jacobs et al. | 205/157 |
| 2004/0121066 A1* | 6/2004 | Anderson et al. | 427/2.11 |
| 2004/0170117 A1* | 9/2004 | Edwards et al. | 369/275.4 |
| 2004/0231781 A1* | 11/2004 | Bao et al. | 156/230 |
| 2004/0235406 A1* | 11/2004 | Duescher | 451/527 |
| 2005/0120902 A1* | 6/2005 | Adams et al. | 101/483 |
| 2005/0121415 A1* | 6/2005 | Paek et al. | 216/41 |
| 2005/0139103 A1* | 6/2005 | Cracauer et al. | 101/327 |
| 2005/0221271 A1* | 10/2005 | Murphy et al. | 435/4 |

* cited by examiner

METHOD FOR LARGE-AREA PATTERNING DISSOLVED POLYMERS BY MAKING USE OF AN ACTIVE STAMP

REFERENCE TO GOVERNMENT CONTRACT

This invention was made with Government support by NIST, under NIST contract number NIST 70NANB0H3033, and the Government has certain rights in this invention.

BACKGROUND

Large-area electronics based on polymeric semiconductors, for applications such as display systems, often require the deposition and patterning of solution processable polymeric materials over large areas. Various printing techniques have been used to achieve the deposition and patterning. However, each of these printing techniques suffers from a number of problems.

One polymeric material deposition method uses ink jet printing to deposit droplets of polymeric material. However, ink jet printing is a slow sequential process. Using multiple ink jet nozzles to print in parallel speeds up the process but also dramatically increases complexity and expense.

A second patterning method uses liquid embossing. A publication by Bulthaup et al., Applied Physics Letters 79 (10) 1525, (2001), describes depositing an "ink" on a substrate and patterning the ink in a liquid embossing process. In order to pattern the ink, a stamp displaces the "ink" and creates a reverse or negative image on the substrate relative to the pattern in the stamp. In addition, after removal of the stamp, the "ink" is still liquid and is cured before handling. The curing process reduces the robustness and throughput of the process. Furthermore, heating the substrate to cure the "ink" can also degrade the electrical properties of the embossed polymer.

S. Y. Chou in U.S. Pat. No. 5,772,905 describes using conventional embossing and nanoprint lithography to flow a thin film under a stamp to create a pattern. An anisotropic etching step, such as reactive ion etching (RIE), finishes the pattern definition. Conventional nanoprint lithography often involves exposing the patterned polymer to high temperatures, UV exposure and etching processes. These processes result in a harsh environment that potentially degrades the electrical properties of the polymeric semiconductor.

Still other techniques use a surface-energy pattern on a substrate to pattern a polymer. C. R. Kagan et al. in Appl. Phys. Lett. 79 (21) 3536 (2001) describes patterning self-assembled monolayers using such a surface-energy pattern. Such patterns are typically generated using surface energy modulation. However, use of such a system in electronic device fabrication is restricted to surfaces on which a self-assembled monolayer can be deposited (typically the noble metals such as gold or palladium). An additional coating step, typically accomplished through dip-coating the surface-energy pattern of the substrate over the entire substrate area is complex and slow, lowering throughput and yield.

Thus an improved method of patterning a polymer is needed.

BRIEF SUMMARY

A method of forming an using a stamping procedure to pattern a surface is described. In the method, a liquid carrier solution including a liquid carrier and a precipitate is deposited on a substrate. A relief pattern on a stamp is brought into contact with the liquid carrier solution such that raised portions of the relief pattern absorbs the liquid carrier leaving a thin precipitate layer between the raised portions of the relief pattern and the substrate. Both liquid carrier and precipitate are removed from substrate regions between the substrate and non-raised portions of the relief pattern. When, the stamp is removed, a precipitate pattern or residue pattern that matches the raised portions of the relief pattern on the stamp remains on the substrate.

DETAILED DESCRIPTION

A novel stamping procedure to pattern a polymer is described. In the procedure a relief pattern that includes raised portions and non-raised portions is formed on a stamp. The relief pattern is brought into contact with a polymer. When the relief pattern is removed, the remaining polymer pattern matches the raised portions of the relief pattern.

Figure 1:
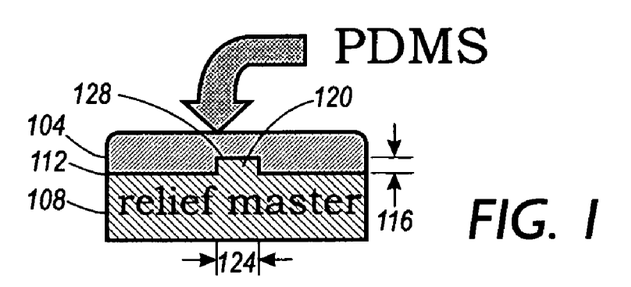
FIG. 1–4 shows the operations used in forming a relief pattern on a stamp.

FIGS. 1–4 show one method of forming a relief pattern on a stamp. In FIG. 1, a material used to form a stamp 104 is deposited over a relief master 108. The stamp material should be a material that is capable of making a conformal contact between stamp 104 and a polymer to be stamped. In one embodiment, the stamp material is polydimethylsiloxane (PDMS).

A surface 112 of relief master 108 includes a negative of the relief pattern to be formed on stamp 104. A number of well known techniques, including but not limited to, photolithography and wax printing patterning, may be used to form surface 112 of relief master 108. In one example, height 116 of raised portions 120 on surface 112 of relief master 108 exceeds the width 124 of the raised portion resulting in a height to width ratio in excess of approximately 0.1. In one embodiment, non-raised or "recessed" portions 128 of stamps formed from such relief masters will have a width to depth ratio of less than approximately 10. Actual dimensions of the stamp and the ratios of width to depth may vary considerably as will be later discussed in connection with FIG. 9.

Figure 2:
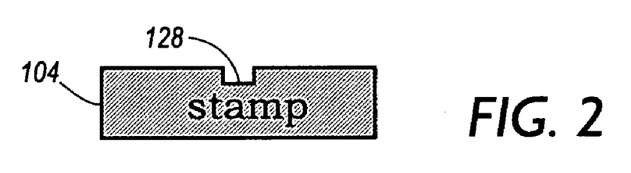
Figure 3:
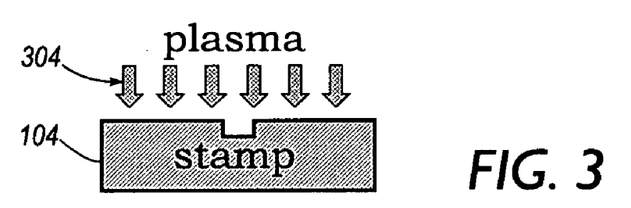
Figure 4:
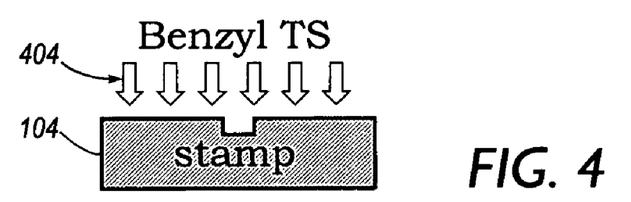

FIG. 2 shows PDMS stamp 104 after removal of relief master 108. Typically, untreated stamp 104 is strongly hydrophobic. In order to reduce stamp hydrophobicity, the stamp is treated. FIGS. 3 and 4 show one treatment that reduces stamp hyrdophobicity by exposing stamp 104 to an oxygen plasma followed by exposure to a reacting agent.

FIG. 3 shows applying an oxygen plasma 304 to the surface of stamp 104. Oxygen plasma 304 oxidizes stamp 104 surface thereby preparing the surface for a reacting agent. In one embodiment, the oxygen prepares the stamp surface to allow covalent bonds to from between a reacting agent and the stamp surface.

After oxidation, stamp 104 is exposed to a reacting solution 404. In one embodiment, a compound in reacting solution 104 forms covalent bonds to the stamp. An example of a compound that forms such covalent bonds are chlorosilane compounds. A hexadecane solution of benzyltrichlorosilane (BTS) is one example of a suitable chlorosilane compound. The reaction with reacting solution 104 reduces stamp hydrophobicity.

Figure 5:
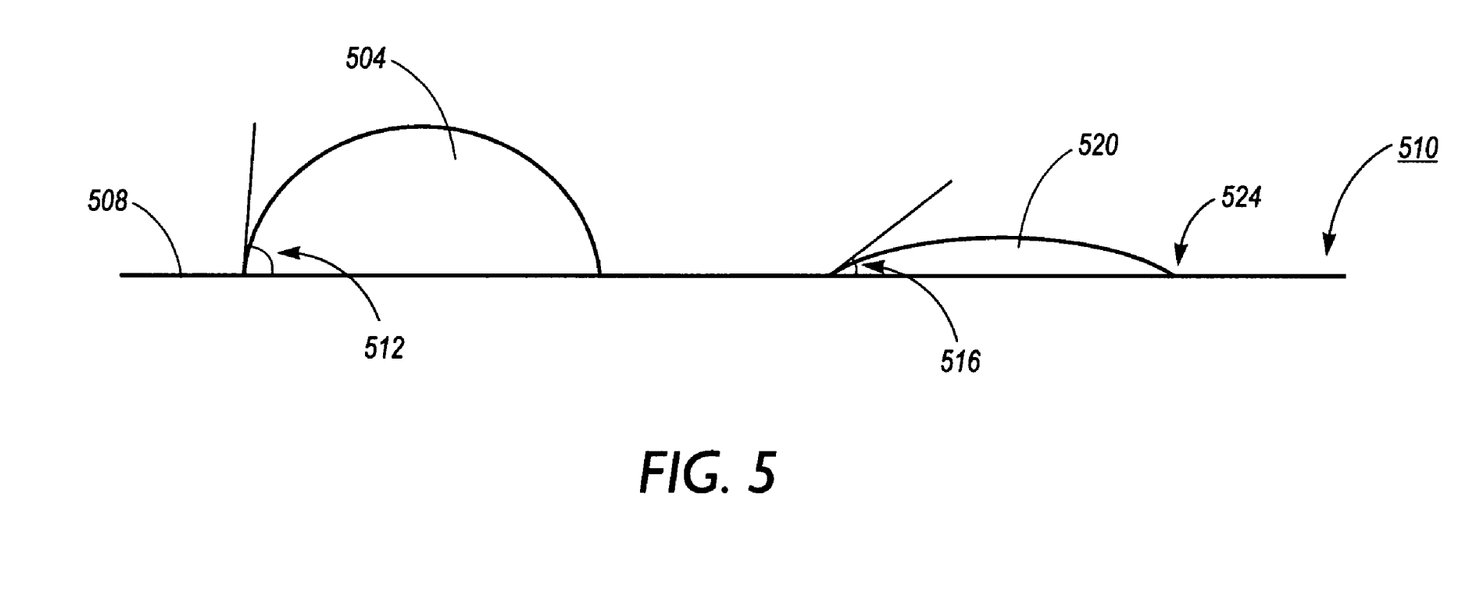
FIG. 5 shows the reaction of water to a treated area of the stamp and the reaction of water to an untreated area of the stamp.

FIG. 5 shows the result of reduced hydrophobicity. A water droplet 504 placed on an untreated portion 508 of a test surface 510 of the stamp will have a contact angle 512 that is larger than the contact angle 516 of a second water droplet 520 deposited on a treated portion 524 of the test surface 510. In one example, the difference in contact angle is exceeds 30 degrees. An example range of contact angles 512 before treatment is between 90 and 110 degrees. An example range of contact angles after treatment range is between 0 and 60 degrees.

Figure 6:
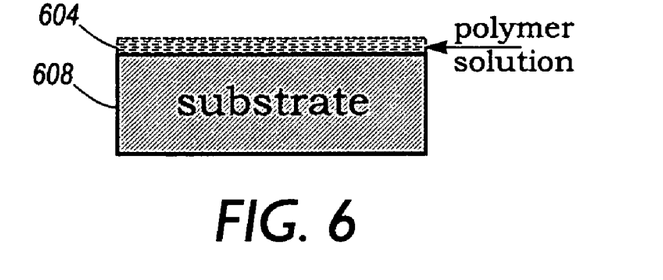
FIG. 6–8 shows the sequence of operations in using the stamp to form a polymer pattern on a substrate.
Figure 7:
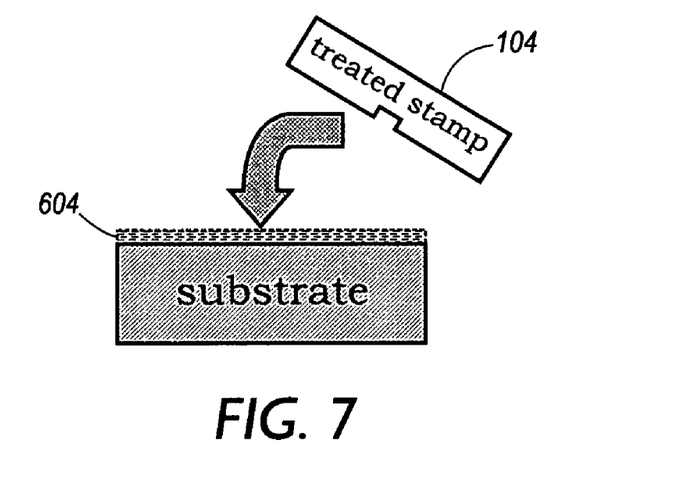
Figure 8:
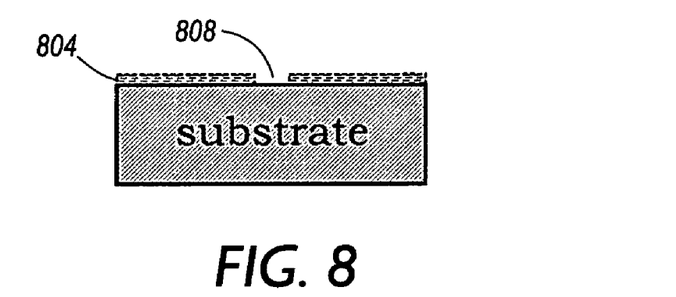

FIG. 6–8 illustrates using a stamp to pattern a polymer deposited on a substrate. A typical polymer may be a polymer solution including a semiconductor material dissolved in a liquid carrier. As used herein a liquid carrier solution is broadly defined to be a liquid that includes a liquid carrier and a material (a precipitate) that remains as a solid when the liquid carrier is removed. In one example, the liquid is a solvent. The precipitate may be a material that is dissolved as a solute in the solvent, such as salt (serving as the precipitate material) in water (the solvent material). Alternately, the precipitate may be a particle in suspension in the liquid carrier, such as a colloidal semiconductor or a nonparticle suspended in a fluid. As used herein, precipitate is broadly defined to be the material carried by the liquid carrier, whether or not it is mixed, dissolved or otherwise combined with the liquid carrier or has been separated out as a solid.

For simplicity, the discussion that follows, the material that precipitates will be described as a polymer and the liquid carrier will be a solvent, although other materials may be used and the claims should not be limited to solvents and liquid polymers.

When forming an electronic device, the precipitate carried by the liquid carrier is a semiconductor material that often has electrical properties suitable for forming an electronic device. The solvent solution keeps the semiconductor in a liquid state. One example of a typical polymer is poly -9.9', dioctyl-fluorene-cobithiophene (F8T2). FIG. 6 shows a thin polymer solution 604, typically having a depth between 1 micrometer and 100 micrometers, deposited on a substrate 608. Possible methods for depositing polymer solution 604 include spin coating for a period of a few seconds at low speed, doctor-blading or dip-coating.

After polymer deposition, FIG. 7 shows bringing stamp 104 in contact with polymer solution 604. Contact is usually maintained for a few seconds, sufficient time for capillary action or another absorption mechanism to draw the solvent into the stamp. As will be described in FIG. 9, in one embodiment, the walls of the relief pattern on stamp 104 absorbs the solvent drawing semiconductor or polymer residue onto the walls of the relief pattern of stamp 104. The stamp thus removes material directly beneath recessed portions of the stamp 104 relief pattern.

FIG. 8 shows a cross section of material remaining on substrate 608 after stamp 104 is removed. The dry semiconductor and/or polymer material 804 surrounds opening 808. Opening 808 corresponds to the non-raised portions or recessed portions of stamp 104. Thus dry polymer material 804 reproduces a pattern that corresponds to the raised features of stamp 104. The stamping process is a process very similar to relief printing with openings in dry polymer material 804 corresponding to non-raised features of stamp 104.

The remaining precipitate, or dry semiconductor and/or polymer material 804 may have distinctive characteristics. One example characteristic is a very uniform deposition of polymer material 804 across substrate 608. In other deposition techniques that rely on evaporation, a "coffee ring" effect may occur in that uneven evaporation of solute causes uneven distribution of precipitate, more particularly, a very slight increase in precipitate height occurs toward the center of the deposited layer. By using a stamp that uniformly absorbs solvent across the surface of polymer material 804, the described stamping technique can be adjusted to avoid such uneven effects.

Figure 9:
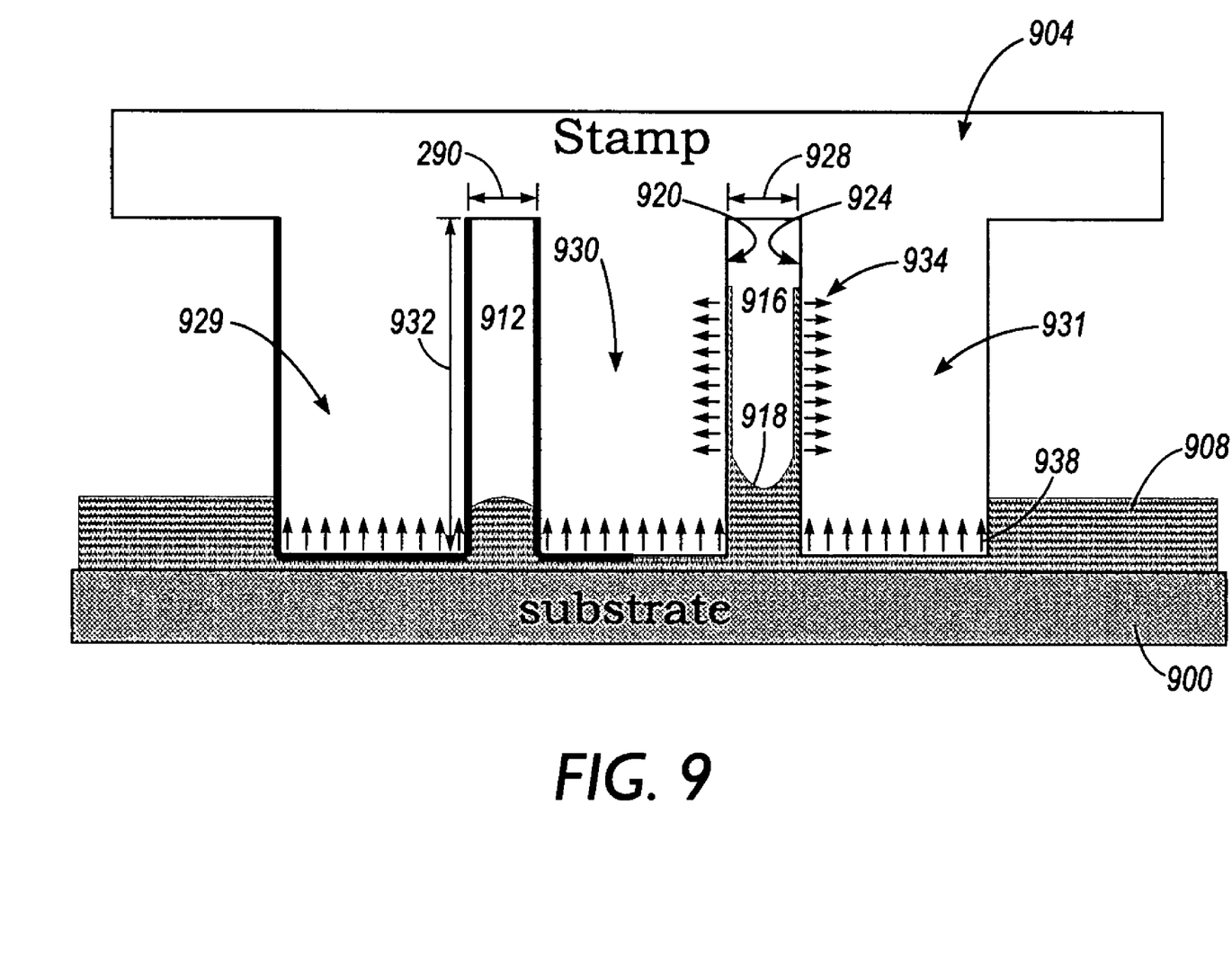
FIG. 9 shows the interactions that occur between stamp and polymer solution to produce the desired pattern.

FIG. 9 is a cross sectional view illustrating the interaction between stamp 904 and a polymer solution 908. Capillary forces and solvent absorption in stamp 904 permits removal of material, including semiconductor material from regions underlying recessed areas of stamp 904.

Stamp 904 is pressed into polymer solution 908 forming an airtight or conformal contact. A force, typically from a pressure differential, forces liquid in polymer solution 908 into recesses 912, 916. The pressure differential may be caused by inducing a gas flow along channels coupling the recessed areas of the stamp to lower the pressure in the recessed areas of the stamp. Alternately, the reduced hydrophobic nature of the stamp surface causes capillary action that draws the liquid polymer solution into the recess such that a concave meniscus 918 forms in the recess. The edge of concave meniscus 918 wets the walls of the stamp recess.

Arrows 934 in FIG. 9 illustrate absorption of the solvent along recess walls 920, 924. The absorption leaves a thin polymer film on recess walls 920, 924. The solvent absorption prevents the complete filling of recess 912, 916 with polymer solution and the creation of back-pressure. In one embodiment capillary action distributes solution to recess walls 920, 924. When capillary action is used, the spacing 928 between adjacent recess walls should not exceed the distance by which capillary action may take place. For capillary action, an example maximum spacing between adjacent recess walls in a F8T2 structure is 250 micrometers. Other elements such as surface energies, viscosity of the fluid, and drying rates may also affect the maximum width of the recess. The ratio of recess depth 932 to width (spacing 290) should not fall below minimum values to prevent solution from completely filling the recess. A second factor in computing a minimum ratio is what ratio prevents solution drawn into the recess from exerting back-pressure. An example minimum ratio of recess depth 932 to recess spacing 290 might be 2.

Arrows 938 of FIG. 9 shows absorption of the solvent in the raised portions 929, 930, 931 of stamp 904. The absorption supersaturates the polymer solution 908 in regions between raised portions 929, 930, 931 and substrate 900. The polymer precipitates out of the supersaturated solution and deposits on substrate 900.

After removal of stamp 904, the stamp recess walls, such as recesses 912, 916 are coated with a thin polymer film while the stamp raised portions 929, 930, 931 remain largely uncoated. In order to minimize distortion in the pattern from stamp swelling, stamp 904 is preferably significantly larger than the volume of solvent absorbed.

FIGS. 10–14 show the procedures used to create a stamp with variable hydrophobicity characteristics. In particular, FIGS. 10–14 show a process that allows for fabrication of a stamp that has low surface energy (higher hydrophobicity) in raised regions and a higher surface energy (lower hydrophobicity) in the recessed regions. Such variable hydrophobicity stamps reduce the probability of polymer adhesion to raised portions of the stamp and increase the probability of polymer adhesion to recessed portions of the stamp.

Figure 10:
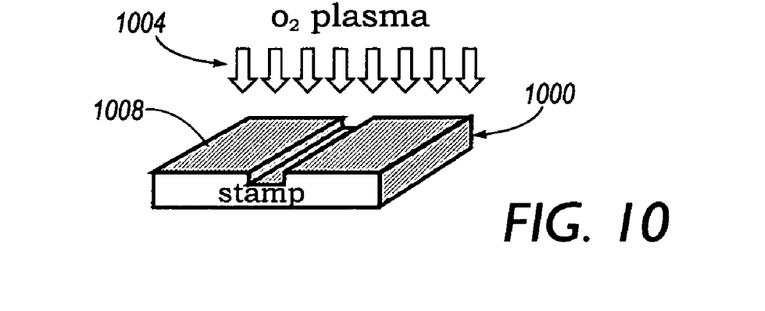
FIGS. 10–13 show one sequence of operations to treat a stamp to adjust hydrophobicity across various stamp surfaces.
Figure 11:
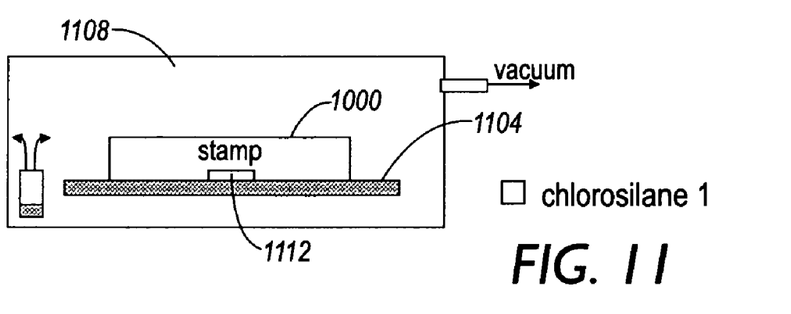

In FIG. 10, a relief surface 1008 of stamp 1000 is exposed to an oxygen plasma 1004. Oxygen plasma 1004 oxidizes relief surface 1008. Oxidation facilitates covalent bond formation between relief surface 1008 and chlorosilane compounds. After oxidation, relief surface 1008 is placed in conformal contact with a flat surface 1104 as shown in FIG. 11. A silicon wafer may be used as a typical flat surface. A first chlorolsilane vapor, such as benzyltrichlorosilane (BTS) gas, introduced into chamber 1108 surrounds stamp 1000. The first chlorosilane vapor wicks into relief surface channels contacting recessed regions 1112. The walls of the recessed regions thus form covalent bonds with the first chlorosilane compound. Raised portions of the relief pattern in contact with flat surface 1104 avoid contact with the first chlorosilane vapor.

Figure 12:
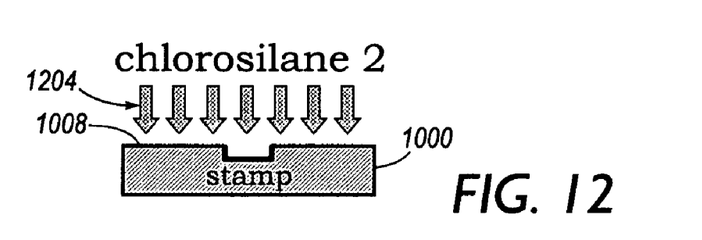

After flat surface 1104 is removed, the relief surface 1008 is exposed to a second chlorosilane compound 1204, such as tridecafluoro-1,1,2,2,-tetrahydrooctyl trichlorosilane (FTS) as shown in FIG. 12. The second chlorosilane compound differs from the first cholosilane compound in that the second chlorosilane compound reduces the surface energy of the treated surface. Second chlorosilane compound deposition may occur either by vapor deposition or solution deposition. The entire relief surface 1008 may contact the second chlorosilane compound, however, only relief pattern areas unexposed to the first chlorosilane reacts with the second chlorosilane. More particularly, only raised regions 1208 of relief surface 1008 that have not already formed covalent bonds with the first chlorosilane compound reacts by forming covalent bonds with the second chlorosilane compound.

Figure 13:
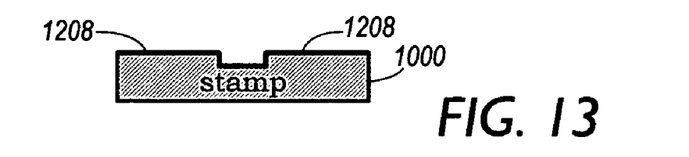

FIG. 13 shows resulting stamp 1000. Stamp 1000 includes a recessed region bonded to the first chlorosilane compound. The high surface energy of the recessed region facilitates solution wicking into the channel. Stamp 1000 also includes raised regions 1208 bonded to the second chlorosilane compound. The low surface energy of the raised regions reduce the probability that patterned polymer film will adhere to raised regions 1208. The varying surface energy shown in FIG. 13 improves the output of the stamping system of FIG. 9.

Figure 14:
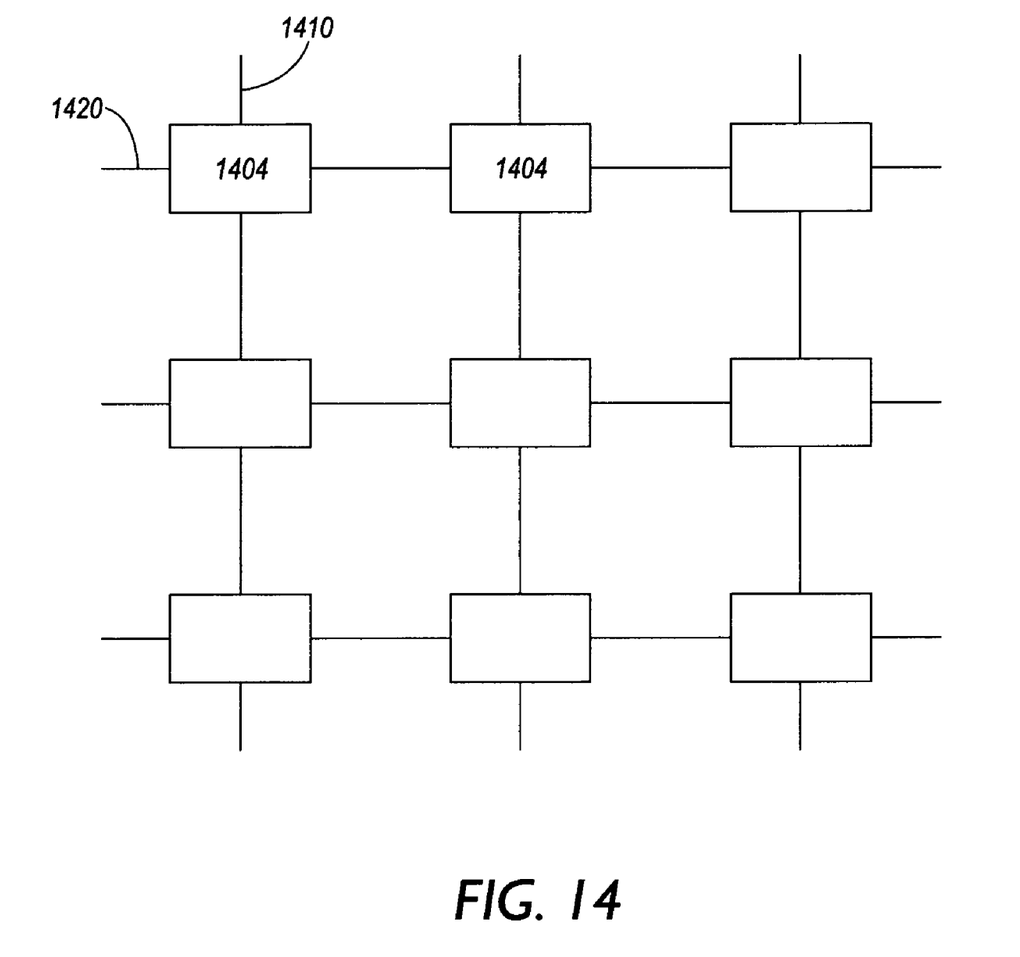
FIG. 14 shows the use of the stamped surface in a display device.

FIG. 14 shows the using the polymer patterns formed by the stamping procedure in a display device. By coupling contacts 1410 and 1420 to polymer pixels 1404 formed by stamping, a pixel of the display device is formed. Each polymer pixel 1404 ranges in width from approximately 50 microns to 500 microns (dimensions). A similar structure also may be used to form a sensor array.

In the preceding description, a number of details have been provided. For example, polymer compounds and particular treatments of adjusting the stamp surface have been described. However, such details are included to assist the reader in understanding various ways in which the invention may be used and should not be interpreted to limit the scope of the invention. The invention itself should only be limited by the following claims.

The invention claimed is:

1. A method of forming an patterned surface feature comprising the operations of:
   depositing a liquid carrier solution including a liquid carrier carrying a precipitate on a substrate;
   bringing a relief pattern formed on a stamp into contact with the liquid carrier solution such that raised portions of the relief pattern absorbs the liquid carrier leaving a precipitate layer between the raised portions of the relief pattern and the substrate, the non-raised portions of the relief pattern drawing the liquid carrier solution including both the liquid carrier and the precipitate away from the substrate surface; and,
   removing the stamp such that a pattern remains on the substrate, the precipitate layer patterned to match the raised portions of the relief pattern.

2. The method of claim 1 wherein the patterned precipitate layer is part of an electronic device structure.

3. The method of claim 1 wherein the relief pattern is in contact with the liquid carrier solution for a period of time between 0.5 seconds and 60 seconds.

4. The method of claim 1 wherein the liquid carrier solution is a polymeric material in an organic solvent.

5. The method of claim 1 wherein the deposition of the liquid carrier solution is done by spin coating.

6. The method of claim 1 wherein the deposition of the liquid carrier solution is done by dip-coating.

7. The method of claim 1 wherein the non-raised portions of the relief pattern form channels in the relief pattern.

8. The method of claim 1 wherein the lateral distance between the walls surrounding the non-raised areas of the relief pattern do not exceed 200 micro-meters.

9. The method of claim 1 wherein capillary action pulls the liquid carrier solution into the non-raised portions of the relief pattern for absorption of the liquid carrier by said non-raised portions of the relief pattern.

10. The method of claim 1 wherein removal of the stamp results in a planar precipitate layer.

11. The method of claim 1 wherein the liquid carrier is a solvent.

12. The method of claim 11 wherein the precipitate layer is a polymer that is dissolved in the solvent.

13. The method of claim 1 wherein the precipitate is a polymer.

14. The method of claim 13 wherein the polymer is suspended in the liquid carrier.

15. The method of claim 1 wherein the precipitate layer is a polymer that results in a polymer pattern, the method further comprising:
   coupling contacts to the polymer pattern.

16. The method of claim 15 further comprising:
   integrating the polymer pattern into a display device.

17. The method of claim 1 further comprising:
   generating a pressure differential to move the liquid carrier solution into the non-raised portions of the relief pattern.

18. The method of claim 17 wherein the pressure differential is generated by treating the stamp such that raised portions of the relief pattern have a higher hydrophobicity than non-raised portions of the relief pattern.

19. The method of claim 11 wherein the pressure differential is generated by flowing a gas through the non-raised portions of the relief pattern.

20. The method of claim 1 wherein the raised portions of the relief pattern have a lower surface energy than the surface energy of relief pattern walls surrounding the non-raised portions of the relief pattern.

21. The method of claim 20 wherein the raised portions are coated with a first chlorosilane compound and the walls surrounding the nonraised portions of the relief pattern are coated with a second chlorosilane compound.

22. The method of claim 21 wherein the first chlorosilane compound is hydrophobic compared to the second chlorosilane compound.

23. The method of claim 1 further comprising the operations of:
   treating the relief pattern of the stamp such that the raised areas of the stamp have a higher hydrophobicity than the non-raised areas of the stamp.

24. The method of claim 23 wherein the stamp is a polydimethylsiloxane (PDMS) stamp that is treated with a plasma oxidizing the PDMS surface allowing it to react with a reactive solution that reduces the surface energy of the non-raised portions of the relief pattern.

25. The method of claim 24 wherein a flow of the oxidizing plasma is controlled to only oxidize the non-raised portions of the relief pattern.

26. The method of claim 24 wherein a flow of the reactive solution is controlled to only react with the non-raised portions of the relief pattern.

27. The method of claim 24 wherein the plasma is an oxygen plasma and the reactive solution is a hexadecane solution.

28. The method of claim 27 wherein the hexadecane solution includes benzyltrichlorosilane (BTS).

* * * * *